United States Patent
Bae et al.

(10) Patent No.: US 8,264,143 B2
(45) Date of Patent: Sep. 11, 2012

(54) ORGANIC LIGHT EMITTING DISPLAY

(75) Inventors: Sungjoon Bae, Guri-si (KR); Kyungman Kim, Anyang-si (KR); Youngmi Kim, Incheon (KR); Hojin Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 213 days.

(21) Appl. No.: 12/340,397

(22) Filed: Dec. 19, 2008

(65) Prior Publication Data
US 2009/0167132 A1 Jul. 2, 2009

(30) Foreign Application Priority Data
Dec. 31, 2007 (KR) .................. 10-2007-0141353

(51) Int. Cl.
*H01J 7/00* (2006.01)
*B32B 37/02* (2006.01)
(52) U.S. Cl. ............ 313/512; 313/504; 313/506; 445/25
(58) Field of Classification Search .......... 313/495–512; 445/24–25; 315/169.3, 169.4; 257/40, 79; 428/690, 917; 349/139
See application file for complete search history.

(56) References Cited

U.S. PATENT DOCUMENTS

| 5,874,804 | A | * | 2/1999 | Rogers | 313/512 |
| 6,081,071 | A | * | 6/2000 | Rogers | 313/512 |
| 6,589,675 | B2 | * | 7/2003 | Peng | 428/690 |
| 2003/0122476 | A1 | * | 7/2003 | Wang et al. | 313/493 |
| 2005/0269926 | A1 | * | 12/2005 | Fukuoka et al. | 313/123 |
| 2007/0172971 | A1 | * | 7/2007 | Boroson | 438/26 |
| 2007/0267648 | A1 | | 11/2007 | Hwang et al. | |
| 2007/0279571 | A1 | | 12/2007 | Koo et al. | |

FOREIGN PATENT DOCUMENTS

| CN | 101075612 A | 11/2007 |
| CN | 101083277 A | 12/2007 |

* cited by examiner

*Primary Examiner* — Anh Mai
*Assistant Examiner* — Elmito Breval
(74) *Attorney, Agent, or Firm* — Birch, Stewart, Kolasch & Birch, LLP

(57) ABSTRACT

An organic light emitting display including a first substrate, a second substrate spaced from and positioned opposite the first substrate, a display unit positioned between the first and second substrates, a multi-layered structure between outside areas of the first and second substrates, and an adhesive member positioned in a formation area of the multi-layered structure and configured to seal the first and second substrates.

13 Claims, 4 Drawing Sheets

ORGANIC LIGHT EMITTING DISPLAY

This application claims the benefit of Korean Patent Application No. 10-2007-141353 filed on Dec. 31, 2007, which is incorporated herein by reference for all purposes as if fully set forth herein.

BACKGROUND OF THE INVENTION

1. Field of the Invention

The present invention relates to an organic light emitting display.

2. Description of the Related Art

An organic light emitting element used in an organic light emitting display is a self-emitting element including a light emitting layer between two electrodes on a substrate. The organic light emitting element is classified into a top or bottom emission type organic light emitting element depending on a direction in which light is emitted. The organic light emitting element is also classified into a passive or active matrix type organic light emitting element depending on a manner in which the display is driven.

Further, the organic light emitting display easily degrades because of external factors such as moisture, oxygen and ultraviolet rays as well as because of manufacturing conditions of the organic light emitting element. In particular, the moisture and oxygen penetrate the display from the outside and reduce the life span of the organic light emitting element. Therefore, the organic light emitting display is sealed.

In the related art, a sealing substrate and an adhesive member are used to seal the organic light emitting display. However, the reliability of the organic light emitting element is still reduced by the penetrating moisture and oxygen.

SUMMARY OF THE INVENTION

Accordingly, one object of the present invention is to address the above-noted and other drawbacks.

To achieve these and other advantages and in accordance with the purpose of the present invention, as embodied and broadly described herein, the present invention provides in one aspect an organic light emitting display including a first substrate, a second substrate spaced from and positioned opposite the first substrate, a display unit positioned between the first and second substrates, a multi-layered structure between outside areas of the first and second substrates, and an adhesive member positioned in a formation area of the multi-layered structure and configured to seal the first and second substrates.

In another aspect, the present invention provides a method of manufacturing an organic light emitting display, and which includes positioning a first substrate to be spaced from and opposite a second substrate, providing a display unit between the first and second substrates, forming a multi-layered structure between outside areas of the first and second substrates, and forming an adhesive member in a formation area of the multi-layered structure so as to seal the first and second substrates.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail embodiments of the invention examples of which are illustrated in the accompanying drawings.

First Embodiment

Figure 1:
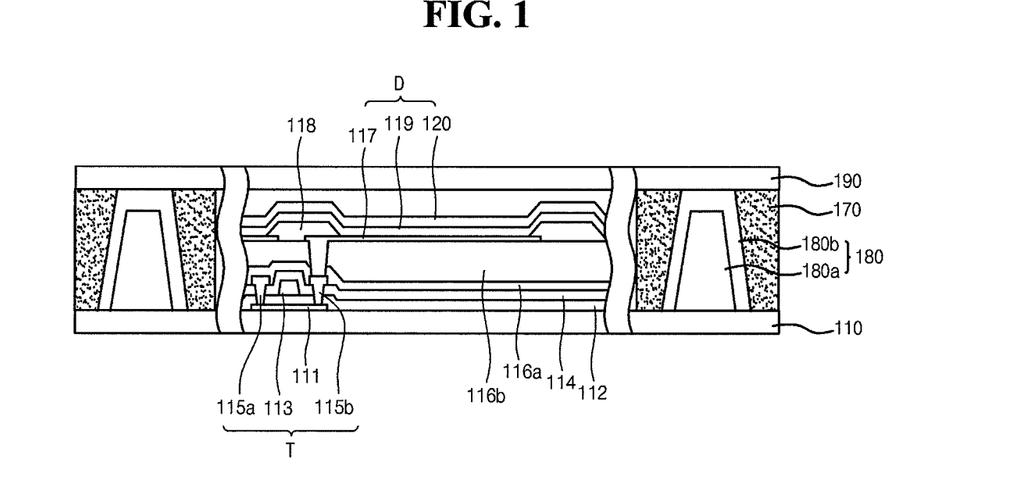
FIGS. 1 and 2 are cross-sectional views illustrating an organic light emitting display according to a first embodiment of the invention.
Figure 2:
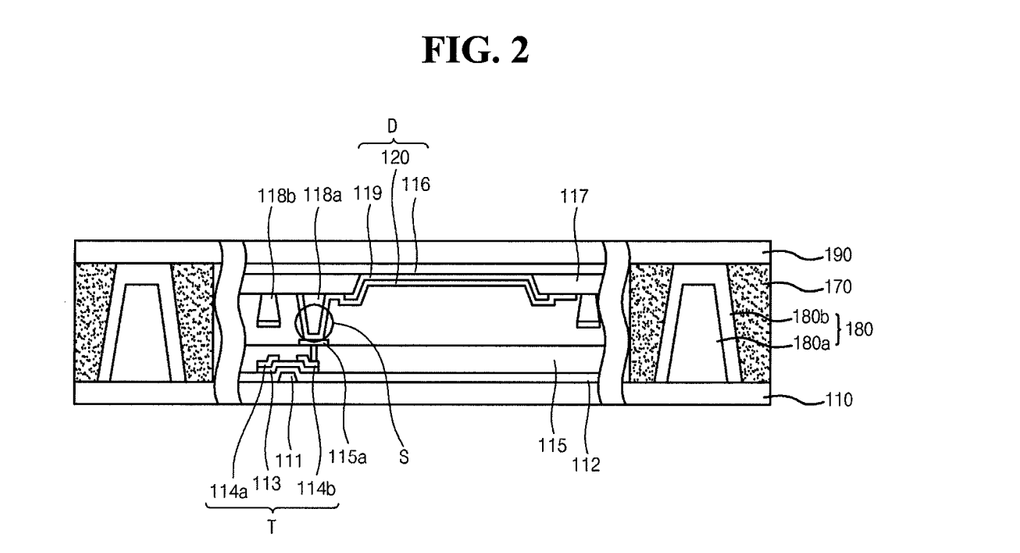

FIGS. 1 and 2 are cross-sectional views illustrating an organic light emitting display according to a first embodiment of the invention. As shown in FIG. 1, the organic light emitting display includes a first substrate 110 formed of glass, metal, ceramic or plastic such as polycarbonate resin, acrylic resin, vinyl chloride resin, polyethyleneterephthalate (PET) resin, polyimide resin, polyester resin, epoxy resin, silicon resin, and fluoride resin. The first substrate 110 however is not limited to theses materials.

The organic light emitting display also includes a second substrate 190 that is spaced apart and positioned opposite to the first substrate 110. Further, the second substrate 190 may be formed of any one of the materials of the first substrate 10 depending on a light emitting direction of the organic light emitting display. Also, the organic light emitting display includes a display unit between the first and second substrates 110 and 190. The display unit includes a subpixel including a transistor T and an organic light emitting diode D connected to a source electrode or a drain electrode of the transistor T.

In addition, and as shown in FIGS. 1 and 2, the organic light emitting display includes a structure 180 having a multi-layered structure between outside areas of the first and second substrates 110 and 190. The structure 180 is not limited to the shape shown in FIGS. 1 and 2, and may be positioned on at least one of the first substrate 110 and the second substrate 190.

Further, the structure 180 shown in FIGS. 1 and 2 has a multi-layered profile in which at least one of an organic material, an inorganic material, a moisture absorbent, or a metal is stacked. Therefore, because the structure 180 has the multi-layered profile, moisture and oxygen penetrating from the outside is blocked by the organic material, the inorganic material and the metal constituting the multi-layered profile. Further, the moisture and the oxygen penetrating the organic material, the inorganic material and the metal are absorbed by the moisture absorbent.

Further, the structure 180 in FIGS. 1 and 2 has a two-layered structure on the first substrate 110. In this embodiment, the two-layered structure includes a first layer 180a formed of an organic material and a second layer 180b formed of an inorganic material or a metal. However, the first layer 180a may be formed of an inorganic material or a metal, and the second layer 180b may be formed of an organic material.

In addition, the organic material forming the first layer 180a may include acrylic resin, polyimide resin or benzocyclobutene (BCB) resin, but is not limited to these materials. The inorganic material forming the second layer 180b may include glass, silicon oxide ($SiO_2$) or silicon nitride ($SiN_x$), but is also not limited to these materials. Also, the metal forming the second layer 180b may include aluminum (Al), molybdenum (Mo) or aluminum neodymium (AlNd), but is not limited to these materials.

Further, in FIGS. 1 and 2, the organic light emitting display also includes an adhesive member 170 that is positioned in a formation area of the structure 180 and is used to seal the first substrate 10 and the second substrate 190. The adhesive member 170 may also be positioned outside and/or inside the structure 180, and may be formed of any one of an edge sealant, a front sealant, and a frit.

As described above, because the structure 180 is formed and the first substrate 110 and the second substrate 190 are sealed using the adhesive member 170, a moisture permeation path is narrowed, and the organic light emitting display has a sealing structure with excellent closeness. More specifically, moisture and oxygen penetrating from the outside are first blocked by the inorganic material or the metal, and the moisture and the oxygen penetrating the inorganic material or the metal are secondly blocked by the organic material. The organic material also blocks and absorbs the moisture and the oxygen penetrating from the outside.

In addition, the structure 180 may be formed using various deposition methods such as a sputter or an evaporation. When the metal forming the structure 180 is Al or AlNd, a water vapor permeation rate of the structure 180 is as follows.

When the thickness of the Al layer forming the structure 180 is 4,000 Å, the structure 180 has a water vapor permeation rate of about $2.88 \times 10^{-3}$ g/m²/day to $5.88 \times 10^{-3}$ g/m²/day per the Al layer of 100 μm in length. When the thickness of the AlNd layer forming the structure 180 is 4,000 Å, the structure 180 has a water vapor permeation rate of about $1.58 \times 10^{-4}$ g/m²/day to $4.58 \times 10^{-3}$ g/m²/day per the AlNd layer of 100 μm in length.

In addition, the water vapor permeation rate represents a water vapor permeation rate of the structure 180 in predetermined conditions. The improved water vapor permeation rate is obtained through the embodiments of the present invention.

In addition, the subpixel generally includes two or more transistors, one or more capacitors, and one or more organic light emitting diodes. For example, FIG. 1 shows the transistor T and the organic light emitting diode D in a cross-sectional view. As shown, the subpixel includes a semiconductor layer 111 on the first substrate 110, a first insulating layer 112 on the semiconductor layer 111, a gate electrode 113 on the first insulating layer 112 at a location corresponding to the semiconductor layer 111, a second insulating layer 114 on the gate electrode 113 and the first insulating layer 112, a source electrode 115a, and a drain electrode 115b.

As shown, the source electrode 115a and the drain electrode 115b are positioned on the second insulating layer 114 at a location corresponding to the semiconductor layer 111. Further, the source electrode 115a and the drain electrode 115b are connected to the semiconductor layer 111 through a contact hole passing through the first and second insulating layers 112 and 114. In addition, the subpixel include a protective layer 116a on the source electrode 115a, the drain electrode 115b and the second insulating layer 114, a planarization layer 116b on the protective layer 116a, and a first electrode 117 on the planarization layer 116b at a location corresponding to the source electrode 115a or the drain electrode 115b.

The first electrode 117 is also connected to the source electrode 115a or the drain electrode 115b through a contact hole passing through the protective layer 116a and the planarization layer 116b. In addition, the subpixel includes a bank layer 118 that is positioned on the first electrode 117 and exposes a portion of the first electrode 117. The subpixel also includes an organic light emitting layer 119 on the first electrode 117 and a second electrode 120 on the organic light emitting layer 119.

The above-described subpixel has a general structure including the transistor T and the organic light emitting diode D on the first substrate 110. The first embodiment also describes a top gate type transistor in which the gate electrode 113 is positioned on the semiconductor layer 111. However, a bottom gate type transistor in which the gate electrode 113 is positioned under the semiconductor layer 111 is also possible.

Further, the subpixel may have a structure as shown in FIG. 2. As shown in FIG. 2, the subpixel include a gate electrode 111 on a first substrate 110, a first insulating layer 112 on a gate electrode 111, a semiconductor layer 113 on a first insulating layer 112 at a location corresponding to the gate electrode 111, a source electrode 114a and a drain electrode 114b contacting the semiconductor layer 113, and the protective layer or a planarization layer 115 on the source electrode 114a and the drain electrode 114b.

The subpixel also includes a metal electrode 115a that is positioned on the protective layer or the planarization layer 115 and is connected to the source electrode 114a or the drain electrode 114b through a contact hole passing through the protective layer or the planarization layer 115. Further, the subpixel includes a first electrode 116 on the second substrate 190, a bank layer 117 exposing the first electrode 116, and a spacer 118a and a cathode separator 118b on the bank layer 117. In addition, the cathode separator 118b may be omitted.

The subpixel also includes an organic light emitting layer 119 on the first electrode 116, and a second electrode 120 on the organic light emitting layer 119. The second electrode 120 positioned on a spacer 118a may be a connection electrode S connected to a metal electrode 115a on the first substrate 110. Thus, with the subpixel structure shown in FIG. 2, a lowest layer of the structure 180 may be formed of the same material as the spacer 118a through the same process as the spacer 118a.

This subpixel has a structure including the transistor T on the first substrate 110 and the organic light emitting diode D on the second substrate 190. Further, the transistor T has a top gate type transistor in which the gate electrode 113 is positioned on the semiconductor layer 111, but may have a bottom gate type transistor in which the gate electrode 113 is positioned under the semiconductor layer 111.

Figure 3:
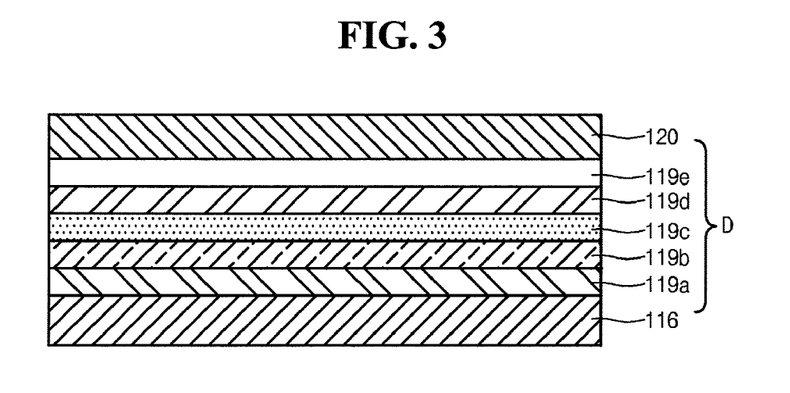
FIG. 3 is an overview illustrating a structure of an organic light emitting diode.

Next, FIG. 3 is an overview illustrating a structure of the organic light emitting diode D shown in FIG. 2. The organic light emitting diode D shown in FIG. 1 may also have the structure shown in FIG. 3.

As shown in FIG. 3, the organic light emitting diode D includes the first electrode 116, a hole injection layer 119a, a hole transport layer 119b, a light emitting layer 119c, an electron transport layer 119d, an electron injection layer 119e, and the second electrode 120. Further, in this embodiment, the hole injection layer 119a is positioned on the first electrode 116, and facilitates the injection of holes from the first electrode 116 to the light emitting layer 119c.

In addition, the hole injection layer 119a may be formed from any one or more of copper phthalocyanine (CuPc), PEDOT(poly(3,4)-ethylenedioxythiophene), polyaniline (PANI) and NPD(N,N-dinaphthyl-N,N'-diphenyl benzidine), etc. but is not limited to these materials. The hole injection layer 119a may also be formed using an evaporation method or a spin coating method.

In addition, as mentioned above, the hole transport layer 119b facilitates the transport of holes. The hole transport layer 119b may also be formed from any one or more of NPD(N,N-dinaphthyl-N,N'-diphenyl benzidine), TPD(N,N'-bis-(3-methylphenyl)-N,N'-bis-(phenyl)-benzidine, s-TAD and MTDATA(4,4',4"-Tris(N-3-methylphenyl-N-phenyl-amino)-triphenylamine), but is not limited to these materials. The hole transport layer 119b may also be formed using an evaporation method or a spin coating method.

In addition, the light emitting layer 119c is formed of a material capable of emitting red, green, blue, and white light, for example, a phosphorescence material or a fluorescence material. When the light emitting layer 119c emits red light, the light emitting layer 119c includes a host material including, for example, carbazole biphenyl (CBP) or N,N-dicarbazolyl-3,5-benzene (mCP). Further, the light emitting layer 119c may be formed of a phosphorescence material including a dopant material including any one or more of PIQIr(acac) (bis(1-phenylisoquinoline)acetylacetonate iridium), PQIr (acac)(bis(1-phenylquinoline)acetylacetonate iridium), PQIr (tris(1-phenylquinoline)iridium) and PtOEP (octaethylporphyrin platinum), or a fluorescence material including PBD:Eu(DBM)3(Phen) or Perylene, but is not limited to these materials.

In addition, when the light emitting layer 119c emits green light, the light emitting layer 119c includes a host material including CBP or mCP. Further, the light emitting layer 119c may be formed of a phosphorescence material including a dopant material including Ir(ppy)3(fac tris(2-phenylpyridine)iridium), or a fluorescence material including Alq3(tris (8-hydroxyquinolino)aluminum), but is not limited to these materials.

Also, when the light emitting layer 119c emits blue light, the light emitting layer 119c includes a host material including CBP or mCP. Further, the light emitting layer 119c may be formed of a phosphorescence material including a dopant material including (4,6-F2ppy)2Irpic, or a fluorescence material including any one of spiro-DPVBi, spiro-6P, distyryl-benzene (DSB), distyryl-arylene (DSA), PFO-based polymer and PPV-based polymer, but is not limited to these materials.

Further, the electron transport layer 119d facilitates the transport of electrons, and may be formed of any one or more of Alq3(tris(8-hydroxyquinolino)aluminum, PBD, TAZ, spiro-PBD, BAlq, and SAlq, but is not limited thereto. The electron transport layer 119d may be formed using an evaporation method or a spin coating method. The electron transport layer 119d can also prevent holes, which are injected from the first electrode 116 and then pass through the light emitting layer 119c, from moving to the second electrode 120. In other words, the electron transport layer 119d serves as a hole stop layer to facilitate the coupling of the holes and the electrons in the light emitting layer 119c.

In addition, the electron injection layer 119e facilitates the injection of electrons and may be formed of Alq3(tris(8-hydroxyquinolino)aluminum), PBD, TAZ, spiro-PBD, BAlq or SAlq, but is not limited to these materials. The electron injection layer 119e may also be formed of an organic material and an inorganic material forming the electron injection layer 119e through a vacuum evaporation method.

Further, the hole injection layer 119a or the electron injection layer 119e may include an inorganic material, and the inorganic material may further include a metal compound. The metal compound may include alkali metal or alkaline earth metal. The metal compound including the alkali metal or the alkaline earth metal may include any one or more of LiQ, LiF, NaF, KF, RbF, CsF, FrF, BeF$_2$, MgF$_2$, CaF$_2$, SrF$_2$, BaF$_2$, and RaF$_2$, but is not limited to these materials.

Thus, the inorganic material inside the electron injection layer 119e facilitates hopping of electrons injected from the second electrode 120 to the light emitting layer 119c, so that holes and electrons injected into the light emitting layer 119c are balanced. Accordingly, the light emission efficiency is improved.

In addition, the inorganic material inside the hole injection layer 119a reduces the mobility of holes injected from the first electrode 116 to the light emitting layer 119c, so that holes and electrons injected into the light emitting layer 119c are balanced. Accordingly, the light emission efficiency is improved.

Further, the first embodiment of the invention is not limited to the structure of the organic light emitting diode D shown in FIG. 3. For example, at least one of the hole injection layer 119a, the hole transport layer 119b, the electron transport layer 119d, and the electron injection layer 119e may be omitted.

In the following embodiments, a detailed description of the structure of the subpixel is not repeated.

Second Embodiment

Figure 4:
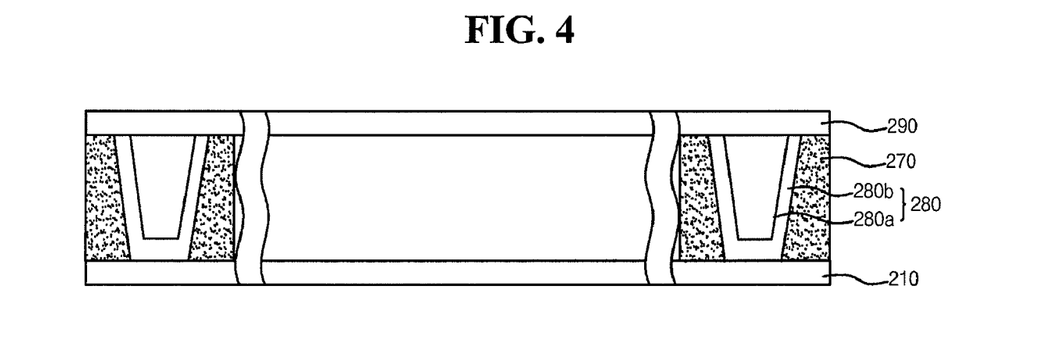
FIG. 4 is a cross-sectional view illustrating an organic light emitting display according to a second embodiment of the invention.

FIG. 4 is a cross-sectional view of an organic light emitting display according to a second embodiment of the invention. As shown in FIG. 4, the organic light emitting display includes a first substrate 210. The first substrate 210 may be formed of glass, metal, ceramic or plastic such as polycarbonate resin, acrylic resin, vinyl chloride resin, polyethyleneterephthalate (PET) resin, polyimide resin, polyester resin, epoxy resin, silicon resin, and fluoride resin, but is not limited to these materials.

The organic light emitting display also includes a second substrate 290 that is spaced from and positioned opposite to the first substrate 210. The second substrate 290 may be formed of any one of the formation materials of the first substrate 210 depending on a light emitting direction of the organic light emitting display.

Further, as discussed in the first embodiment, the organic light emitting display include a display unit between the first and second substrates 210 and 290. The structure of the subpixel included in the display unit was described in the first embodiment and is not repeated here.

In addition, the organic light emitting display include a structure 280 having a multi-layered structure between outside areas of the first and second substrates 210 and 290. The structure 280 is also not limited to the shape shown in FIG. 4, and is positioned on at least one of the first substrate 210 and the second substrate 290.

Further, the structure 280 has a multi-layered profile in which at least one of an organic material, an inorganic material, a moisture absorbent, or a metal is stacked. Therefore, because the structure 280 has the multi-layered profile, moisture and oxygen penetrating from the outside are blocked by the organic material, the inorganic material and the metal constituting the multi-layered profile. Further, the moisture and the oxygen penetrating the organic material, the inorganic material and the metal are absorbed by the moisture absorbent.

As shown in FIG. 4, the structure 280 has a two-layered structure on the second substrate 290 including a first layer 280a formed of an organic material and a second layer 280b formed of an inorganic material or a metal. However, the first layer 280a may be formed of an inorganic material or a metal, and the second layer 280b may be formed of an organic material.

In addition, the organic material forming the first layer 280a may include acrylic resin, polyimide resin or benzocyclobutene (BCB) resin, and the inorganic material forming the second layer 280b may include glass, silicon oxide ($SiO_2$) or silicon nitride ($SiN_X$). However, the first and second layers 280a and 280b are not limited to these materials. Further, the metal forming the second layer 280b may include aluminum (Al), molybdenum (Mo) or aluminum neodymium (AlNd), but is also not limited to these materials.

As shown in FIG. 4, the organic light emitting display includes an adhesive member 270 that is positioned in a formation area of the structure 280 and is used to seal the first substrate 210 and the second substrate 290. The adhesive member 270 may also be positioned outside and/or inside the structure 280 and formed of any one of an edge sealant, a front sealant, and a frit.

As described above, because the structure 280 is formed and the first substrate 210 and the second substrate 290 are sealed using the adhesive member 270, a moisture permeation path is narrowed, and the organic light emitting display has a sealing structure with the excellent closeness.

Third Embodiment

Figure 5:
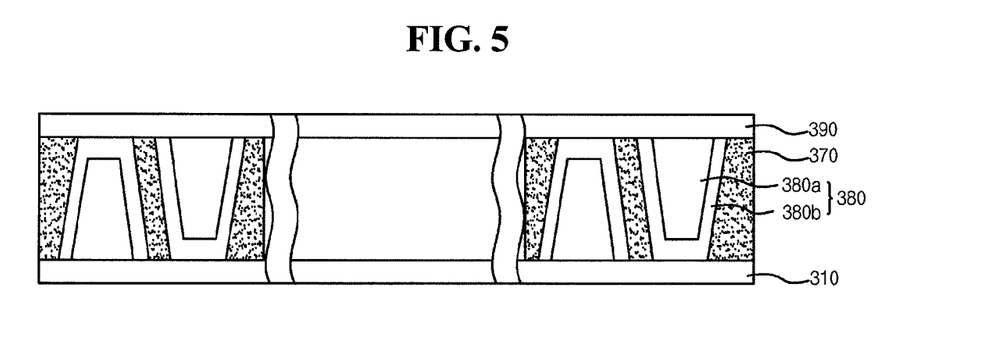
FIG. 5 is a cross-sectional view of an organic light emitting display according to a third exemplary embodiment of the invention.

Next, FIG. 5 is a cross-sectional view of an organic light emitting display according to a third embodiment of the invention. As shown in FIG. 5, the organic light emitting display includes a first substrate 310 formed of glass, metal, ceramic or plastic such as polycarbonate resin, acrylic resin, vinyl chloride resin, polyethyleneterephthalate (PET) resin, polyimide resin, polyester resin, epoxy resin, silicon resin, and fluoride resin, but is not limited to these materials.

The organic light emitting display also includes a second substrate 390 that is spaced from and positioned opposite to the first substrate 310. Further, the second substrate 390 may be formed of any one of the formation materials of the first substrate 310 depending on a light emitting direction of the organic light emitting display.

In addition, and as discussed above, the organic light emitting display includes a display unit between the first and second substrates 310 and 390. The structure of a subpixel included in the display unit is referred to in the first embodiment of the invention.

As shown in FIG. 5, the organic light emitting display includes a structure 380 having a multi-layered structure between outside areas of the first and second substrates 310 and 390. The structure 380 is not limited to the shape shown in FIG. 5, and is positioned on at least one of the first substrate 310 and the second substrate 390.

Further, similar to the other embodiments, the structure 380 has a multi-layered profile in which at least one of an organic material, an inorganic material, a moisture absorbent, or a metal is stacked. Therefore, moisture and oxygen penetrating from the outside are blocked by the organic material, the inorganic material and the metal constituting the multi-layered profile. Further, the moisture and the oxygen penetrating the organic material, the inorganic material and the metal are absorbed by the moisture absorbent.

In the third embodiment of the invention, a plurality of structures 380 have a two-layered structure and are formed on the first substrate 310 to be adjacent to each other. Further, as shown in FIG. 5, a shape of at least one of the plurality of structures 380 is reversed to a shape of the other structures 380.

As shown, the structure 380 includes a first layer 380a formed of an organic material and a second layer 380b formed of an inorganic material or a metal. However, the first layer 380a may be formed of an inorganic material or a metal, and the second layer 380b may be formed of an organic material.

In addition, the organic material forming the first layer 380a may include acrylic resin, polyimide resin or benzocyclobutene (BCB) resin, and the inorganic material forming the second layer 380b may include glass, silicon oxide ($SiO_2$) or silicon nitride ($SiN_X$). However, the layers 380a and 380b may be formed using other materials. The metal forming the second layer 380b may also include aluminum (Al), molybdenum (Mo) or aluminum neodymium (AlNd), but is not limited to these materials.

Also, the organic light emitting display includes an adhesive member 370 that is positioned in a formation area of the structure 380 and is used to seal the first substrate 310 and the second substrate 390. The adhesive member 370 may also be positioned outside and/or inside the structure 380 and may be formed of any one of an edge sealant, a front sealant, and a frit.

As described above, because the plurality of structures 380 are formed and the first substrate 310 and the second substrate 390 are sealed using the adhesive member 370, a moisture permeation path is narrowed, and the organic light emitting display has a sealing structure with the excellent closeness.

Fourth Embodiment

Figure 6:
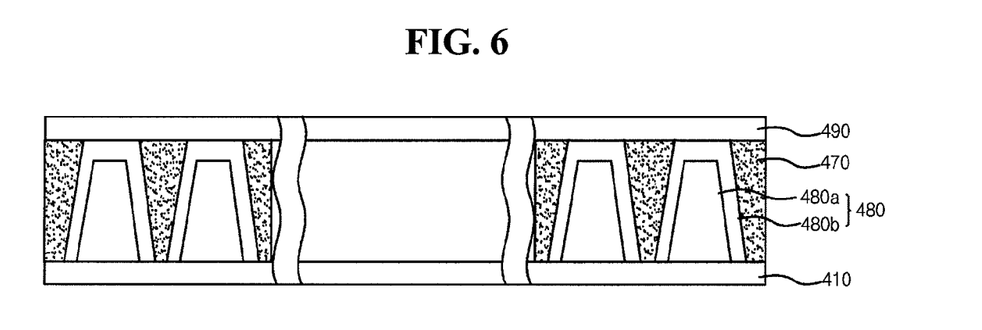
FIG. 6 is a cross-sectional view illustrating an organic light emitting display according to a fourth embodiment of the invention.

FIG. 6 is a cross-sectional view of an organic light emitting display according to a fourth embodiment of the invention. As shown in FIG. 6, the organic light emitting display includes a first substrate 410 formed of glass, metal, ceramic or plastic such as polycarbonate resin, acrylic resin, vinyl chloride resin, polyethyleneterephthalate (PET) resin, polyimide resin, polyester resin, epoxy resin, silicon resin, and fluoride resin, but may be formed of other materials.

Further, the organic light emitting display includes a second substrate 490 that is spaced and positioned opposite to the first substrate 410. The second substrate 490 may also be formed of any one of the formation materials of the first substrate 410 depending on a light emitting direction of the organic light emitting display.

In addition, similar to the other embodiments described above, the organic light emitting display includes a display unit between the first and second substrates 410 and 490. The structure of the subpixel included in the display unit was described in the first embodiment.

As shown in FIG. 6, the organic light emitting display includes a structure 480 having a multi-layered structure between outside areas of the first and second substrates 410 and 490. The structure 480 is not limited to the shape shown in FIG. 6, and is positioned on at least one of the first substrate 410 and the second substrate 490.

The structure 480 also has a multi-layered profile in which at least one of an organic material, an inorganic material, a moisture absorbent, or a metal is sacked. Therefore, and as discussed above, moisture and oxygen penetrating from the outside are blocked by the organic material, the inorganic material and the metal constituting the multi-layered profile. Further, the moisture and the oxygen penetrating the organic material, the inorganic material and the metal are absorbed by the moisture absorbent.

In the fourth embodiment of the invention, a plurality of structures 480 are formed on the first substrate 410 to be adjacent to each other. As shown in FIG. 6, the plurality of structures 480 have a two-layered structure including a first layer 480*a* formed of an organic material and a second layer 480*b* formed of an inorganic material or a metal. However, the first layer 480*a* may be formed of an inorganic material or a metal, and the second layer 480*b* may be formed of an organic material.

In addition, the organic material forming the first layer 480*a* may include acrylic resin, polyimide resin or benzocyclobutene (BCB) resin, and the inorganic material forming the second layer 480*b* may include glass, silicon oxide ($SiO_2$) or silicon nitride ($SiN_x$), but is not limited thereto. Further, the metal forming the second layer 480*b* may include aluminum (Al), molybdenum (Mo) or aluminum neodymium (AlNd). However, other materials may be used.

The organic light emitting display also include an adhesive member 470 that is positioned in a formation area of the structure 480 and is used to seal the first substrate 410 and the second substrate 490. The adhesive member 470 may be positioned outside and/or inside the structure 480, and be formed of any one of an edge sealant, a front sealant, and a frit.

As described above, because the plurality of structures 480 are formed and the first substrate 410 and the second substrate 490 are sealed using the adhesive member 470, a moisture permeation path is narrowed, and the organic light emitting display has a sealing structure with the excellent closeness.

Fifth Embodiment

Figure 7:
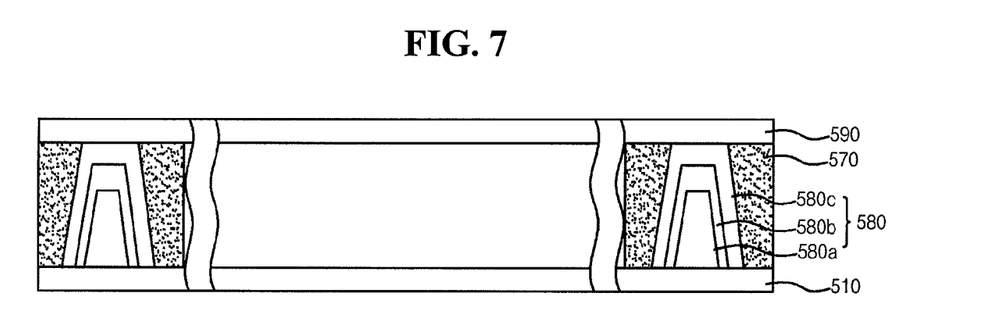
FIG. 7 is a cross-sectional view illustrating an organic light emitting display according to a fifth embodiment of the invention.

FIG. 7 is a cross-sectional view of an organic light emitting display according to a fifth embodiment of the invention.

As shown in FIG. 7, the organic light emitting display includes a first substrate 510 formed of glass, metal, ceramic or plastic such as polycarbonate resin, acrylic resin, vinyl chloride resin, polyethyleneterephthalate (PET) resin, polyimide resin, polyester resin, epoxy resin, silicon resin, and fluoride resin. Other materials may also be used.

The organic light emitting display also includes a second substrate 590 that is spaced and positioned opposite to the first substrate 510. Further, the second substrate 590 may be formed of any one of the formation materials of the first substrate 510 depending on a light emitting direction of the organic light emitting display.

The organic light emitting display also include a display unit between the first and second substrates 510 and 590. Further, the structure of a subpixel included in the display unit is discussed in the first embodiment.

As shown in FIG. 7, the organic light emitting display includes a structure 580 having a multi-layered structure between outside areas of the first and second substrates 510 and 590. Further, the structure 580 is not limited to the shape shown in FIG. 7, and may be positioned on at least one of the first substrate 510 and the second substrate 590.

In addition, the structure 580 has a multi-layered profile in which at least one of an organic material, an inorganic material, a moisture absorbent, or a metal is sacked. Therefore, moisture and oxygen penetrating from the outside are blocked by the organic material, the inorganic material and the metal constituting the multi-layered profile. Further, the moisture and the oxygen penetrating the organic material, the inorganic material and the metal are absorbed by the moisture absorbent.

In the fifth embodiment of the invention, and as shown in FIG. 7, the structure 580 is formed on the first substrate 510 and has a three-layered structure. In particular, the structure 580 includes a first layer 580*a* formed of an organic material, and a second layer 580*b* and a third layer 580*c* formed of an inorganic material or a metal. However, the first layer 580*a* may be formed of an inorganic material or a metal, and the second layer 580*b* and the third layer 580*c* may be formed of an organic material.

In addition, the organic material forming the first layer 580*a* may include acrylic resin, polyimide resin or benzocyclobutene (BCB) resin, the inorganic material forming the second layer 580*b* and the third layer 580*c* may include glass, silicon oxide ($SiO_2$) or silicon nitride ($SiN_x$), and the metal forming the second layer 580*b* and the third layer 580*c* may include aluminum (Al), molybdenum (Mo) or aluminum neodymium (AlNd), but is not limited thereto. Other materials may also be used.

Further, as shown in FIG. 7, the organic light emitting display includes an adhesive member 570 that is positioned in a formation area of the structure 580 and is used to seal the first substrate 510 and the second substrate 590. The adhesive member 570 may be positioned outside and/or inside the structure 580, and be formed of any one of an edge sealant, a front sealant, and a frit.

As described above, because the structure 580 is formed and the first substrate 510 and the second substrate 590 are sealed using the adhesive member 570, a moisture permeation path is narrowed, and the organic light emitting display has a sealing structure with the excellent closeness.

Sixth Embodiment

Figure 8:
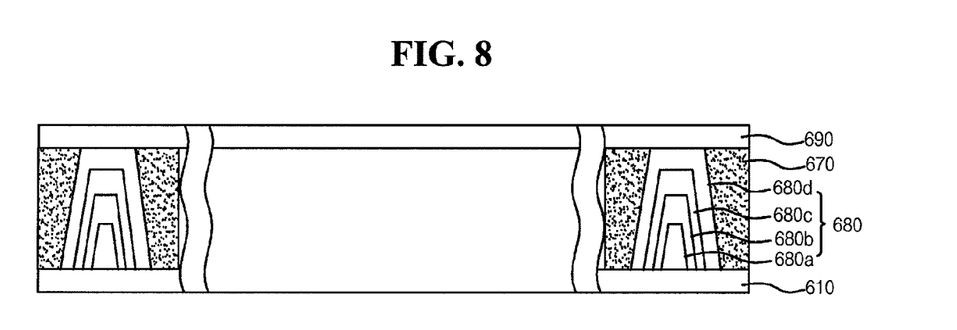
FIG. 8 is a cross-sectional view of an organic light emitting display according to a sixth exemplary embodiment of the invention.

FIG. 8 is a cross-sectional view of an organic light emitting display according to a sixth embodiment of the invention.

As shown in FIG. 8, the organic light emitting display includes a first substrate 610 formed of glass, metal, ceramic or plastic such as polycarbonate resin, acrylic resin, vinyl chloride resin, polyethyleneterephthalate (PET) resin, polyimide resin, polyester resin, epoxy resin, silicon resin, and fluoride resin. Other materials may also be used.

Also included is a second substrate 690 that is spaced from and positioned opposite to the first substrate 610. Further, the second substrate 690 may be formed of any one of the formation materials of the first substrate 610 depending on a light emitting direction of the organic light emitting display.

The organic light emitting display also include a display unit between the first and second substrates 610 and 690 and that was discussed in the first embodiment. The organic light emitting display also includes a structure 680 having a multi-layered structure between outside areas of the first and second substrates 610 and 690. Further, the structure 680 is not limited to the shape shown in FIG. 8, and may be positioned on at least one of the first substrate 610 and the second substrate 690.

In addition, as shown the structure 680 has a multi-layered profile in which at least one of an organic material, an inorganic material, a moisture absorbent, or a metal is sacked. Therefore, moisture and oxygen penetrating from the outside are blocked by the organic material, the inorganic material and the metal constituting the multi-layered profile. Further, the moisture and the oxygen penetrating the organic material, the inorganic material and the metal are absorbed by the moisture absorbent.

In the sixth embodiment of the invention, the structure 680 is formed on the first substrate 610 and has a four-layered structure including a first layer 680a formed of an organic material, a second layer 680b and a fourth layer 680d e formed of an inorganic material or a metal, and a third layer 680c formed of an absorbent material. Alternatively, the first layer 680a may be formed of an inorganic material or a metal, and the second layer 680b and the fourth layer 680d may be formed of an organic material. Also, the third layer 680c may be formed of one of an organic material, an inorganic material, and a metal, and the fourth layer 680d may be formed of an absorbent material.

The organic material forming the first layer 680a may include acrylic resin, polyimide resin or benzocyclobutene (BCB) resin, the inorganic material forming the second layer 680b and the fourth layer 680d may include glass, silicon oxide ($SiO_2$) or silicon nitride ($SiN_x$), and the metal forming the second layer 680b and the fourth layer 680d may include aluminum (Al), molybdenum (Mo) or aluminum neodymium (AlNd). Other materials may also be used.

Further, the organic light emitting display include an adhesive member 670 that is positioned in a formation area of the structure 680 and is used to seal the first substrate 610 and the second substrate 690. The adhesive member 670 may be positioned outside and/or inside the structure 680, and be formed of any one of an edge sealant, a front sealant, and a frit.

As described above, because the structure 680 is formed and the first substrate 610 and the second substrate 690 are sealed using the adhesive member 670, a moisture permeation path is narrowed, and the organic light emitting display has a sealing structure with the excellent closeness.

Seventh Embodiment

Figure 9:
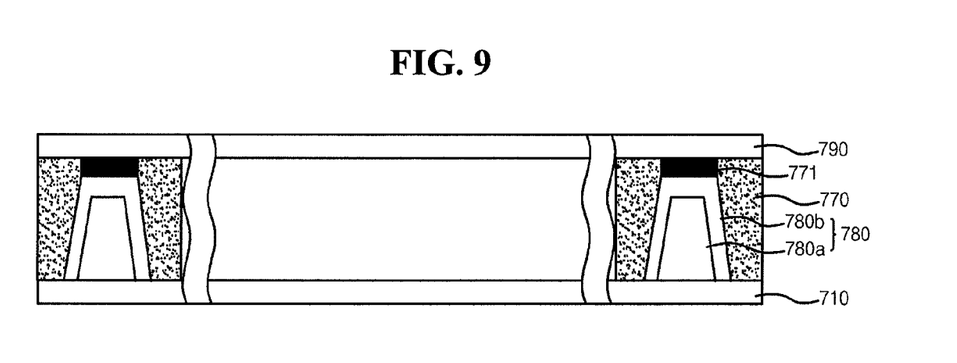
FIG. 9 is a cross-sectional view illustrating an organic light emitting display according to a seventh embodiment of the invention.

FIG. 9 is a cross-sectional view of an organic light emitting display according to a seventh embodiment of the invention. As shown in FIG. 9, the organic light emitting display includes a first substrate 710 formed of glass, metal, ceramic or plastic such as polycarbonate resin, acrylic resin, vinyl chloride resin, polyethyleneterephthalate (PET) resin, polyimide resin, polyester resin, epoxy resin, silicon resin, and fluoride resin, but is not limited to these materials.

The organic light emitting display also includes a second substrate 790 that is separated from and positioned opposite to the first substrate 710. Further, the second substrate 790 may be formed of any one of the formation materials of the first substrate 710 depending on a light emitting direction of the organic light emitting display.

Similar to the other embodiments, the organic light emitting display includes a display unit between the first and second substrates 710 and 790. In addition, the organic light emitting display include a structure 780 having a multi-layered structure between outside areas of the first and second substrates 710 and 790. The structure 780 is not limited to the shape shown in FIG. 9, and may be positioned on at least one of the first substrate 710 and the second substrate 790.

In addition, the structure 780 has a multi-layered profile in which at least one of an organic material, an inorganic material, a moisture absorbent, or a metal is sacked. Therefore, moisture and oxygen penetrating from the outside is blocked by the organic material, the inorganic material and the metal constituting the multi-layered profile. Further, the moisture and the oxygen penetrating the organic material, the inorganic material and the metal is absorbed by the moisture absorbent.

In the seventh embodiment of the invention, the structure 780 is formed on the first substrate 710 and has a two-layered structure including a first layer 780a formed of an organic material and a second layer 780b formed of an inorganic material or a metal. However, the first layer 780a may be formed of an inorganic material or a metal, and the second layer 780b may be formed of an organic material.

Further, the organic material forming the first layer 780a may include acrylic resin, polyimide resin or benzocyclobutene (BCB) resin, the inorganic material forming the second layer 780b may include glass, silicon oxide ($SiO_2$) or silicon nitride ($SiN_x$), and the metal forming the second layer 780b may include aluminum (Al), molybdenum (Mo) or aluminum neodymium (AlNd). Other materials may also be used.

The organic light emitting display also includes a first adhesive member 770 and a second adhesive member 771 that are positioned in a formation area of the structure 780 and are used to seal the first substrate 710 and the second substrate 790. The first adhesive member 770 may be positioned outside and/or inside the structure 780 and be formed on the structure 780. The first adhesive member 770 may be formed of an edge sealant or a front sealant, and the second adhesive member 771 may be formed of a frit.

As described above, because the structure 780 is formed and the first substrate 710 and the second substrate 790 are sealed using the first and second adhesive members 770 and 771, a moisture permeation path is narrowed, and the organic light emitting display has a sealing structure with the excellent closeness.

The first to seventh embodiments of the invention may be suitably combined if necessary, and thus the organic light emitting display having another structure can be provided. The exemplary embodiments of the invention can provide the organic light emitting display capable of being protected from the moisture and the oxygen, and thus the life space and the reliability of the organic light emitting display can be improved.

It will be apparent to those skilled in the art that various modifications and variations can be made in the embodiments of the invention without departing from the spirit or scope of the invention. Thus, it is intended that embodiments of the invention cover the modifications and variations of this invention provided they come within the scope of the appended claims and their equivalents.

What is claimed is:

1. An organic light emitting display comprising:
   a first substrate;
   a second substrate spaced from and positioned opposite the first substrate;
   a display unit positioned between the first and second substrates;
   a multi-layered structure between the first and second substrates; and
   an adhesive member configured to seal the first and second substrates,
   wherein the multi-layered structure comprises at least one of a four-layered structure that is stacked, wherein the four-layered structure has a pillar shape, wherein the four-layered structure includes a first layer formed of an organic material, a second layer and a fourth layer formed of an inorganic material or a metal, and a third layer formed of an absorbent material.

2. The organic light emitting display of claim 1, wherein a shape of the at least one of the four-layered structure is reversed to a shape of other ones of the four-layered structure.

3. The organic light emitting display of claim 2, wherein the at least one of the four-layered structure is positioned on the first substrate, and the other of the four-layered structure is positioned on the second substrate.

4. The organic light emitting display of claim 1, wherein the four-layered structure is positioned on at least one of the first substrate and the second substrate.

5. The organic light emitting display of claim 1, wherein the display unit includes a subpixel including a transistor on the first substrate and an organic light emitting diode connected to a source electrode or a drain electrode of the transistor.

6. The organic light emitting display of claim 1, wherein the display unit includes a subpixel including a transistor on the first substrate, an organic light emitting diode on the second substrate, and a connection electrode that is positioned on a spacer to electrically connect the organic light emitting diode to a source electrode or a drain electrode of the transistor.

7. The organic light emitting display of claim 6, wherein the first layer of the four-layered structure includes a same material as the spacer through a same process as the spacer.

8. The organic light emitting display of claim 1, wherein the adhesive member includes a first adhesive member to adhere the first and the second substrates and a second adhesive member to adhere the second substrate and the fourth layer of the four-layered structure.

9. The organic light emitting display of claim 8, wherein the first adhesive member is formed of an edge sealant or a front sealant, and the second adhesive member is formed of a frit.

10. A method of manufacturing an organic light emitting display, the method comprising:
positioning a first substrate to be spaced from and opposite a second substrate;
providing a display unit between the first and second substrates;
forming a multi-layered structure between the first and second substrates; and
forming an adhesive member in a formation area of the multi-layered structure so as to seal the first and second substrates,
wherein the multi-layered structure comprises at least one of a four-layered structure that is stacked,
wherein the four-layered structure has a pillar shape,
wherein the four-layered structure includes a first layer formed of an organic material, a second layer and a fourth layer formed of an inorganic material or a metal, and a third layer formed of an absorbent material.

11. The method of claim 10, wherein the step of forming the four-layered structure comprises forming a shape of the at least one of the four-layered structure to have a shape that is reversed to a shape of other ones of the four-layered structure.

12. The method of claim 10, wherein the adhesive member includes a first adhesive member to adhere the first and the second substrates and a second adhesive member to adhere the second substrate and the fourth layer of the four-layered structure.

13. The method of claim 12, wherein the first adhesive member is formed of an edge sealant or a front sealant, and the second adhesive member is formed of a frit.

* * * * *